United States Patent [19]
Chiang et al.

[11] Patent Number: 5,736,785
[45] Date of Patent: Apr. 7, 1998

[54] SEMICONDUCTOR PACKAGE FOR IMPROVING THE CAPABILITY OF SPREADING HEAT

[75] Inventors: Cheng Lien Chiang, Taipei; Rong Shen Lee, Hsinchu; Hsing Seng Wang, Chung Li, all of Taiwan

[73] Assignee: Industrial Technology Research Institute, Hsinchu, Taiwan

[21] Appl. No.: 772,670

[22] Filed: Dec. 20, 1996

[51] Int. Cl.⁶ ................................................ H01L 23/34
[52] U.S. Cl. .................... 257/712; 257/713; 257/719; 257/796
[58] Field of Search .................... 257/796, 712, 257/713, 719

[56] References Cited

U.S. PATENT DOCUMENTS

5,616,957  4/1997  Kajihara ........................ 257/796

*Primary Examiner*—Tom Thomas
*Assistant Examiner*—Roy Potter
*Attorney, Agent, or Firm*—Pennie and Edmonds LLP

[57] ABSTRACT

The feature of the present invention is a heatspreader that is attached over a die instead of being set under the die to improve the efficient of spreading heat. A package includes a semiconductor die mounted to a die receiving area of a substrate. The die and a portion of the substrate are connected by using a conventional die attach material. A plurality of bonding wires are attached on the die. Further, conductive traces are on the top surface of the substrate. The die is electrically coupled to conductive traces by the bonding wires, a TAB method or a flip chip method. A plurality of conductive vias are also need for electrically coupling conductive traces on the top surface of the substrate to those on the bottom. Typically, at an end of portion of each conductive trace on the bottom of the substrate is an conductive pad for connecting to a solder ball. The die and portions of the substrate are encapsulated in a package body. A heatspreader is exactly set over the semiconductor die for spreading heat.

37 Claims, 9 Drawing Sheets

SEMICONDUCTOR PACKAGE FOR IMPROVING THE CAPABILITY OF SPREADING HEAT

FIELD OF THE INVENTION

The present invention relates to a semiconductor package, and more specifically, to a package which can improve the efficiency of spreading heat.

BACKGROUND OF THE INVENTION

With the rapid advances in wafer fabrication process technology, IC designers are always tempted to increase chip level integration at an ever faster pace. It has been the trend in integrated circuit (IC) technology to increase the density of semiconductor devices per unit area of silicon wafer. It follows then that the semiconductor devices, such as transistors and capacitors, must be made smaller and smaller. Further, the manufacturers of the devices are striving to reduce the sizes while simultaneously increasing their speed.

Figure 1:
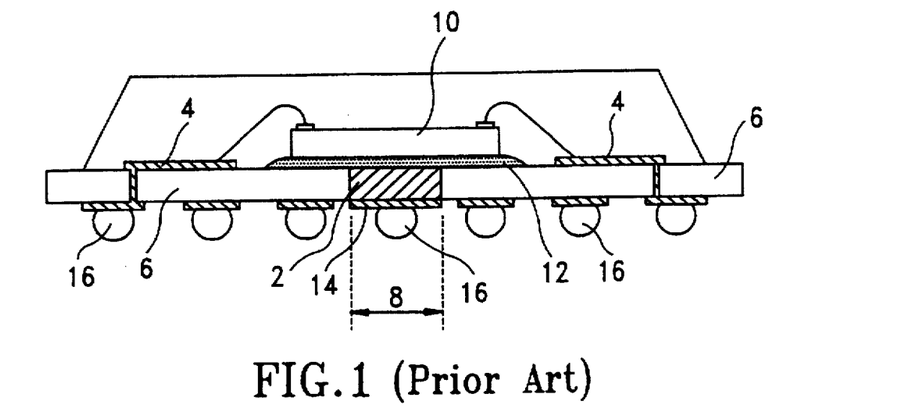
FIG. 1 is a cross section view of a structure of a prior art.
Figure 2:
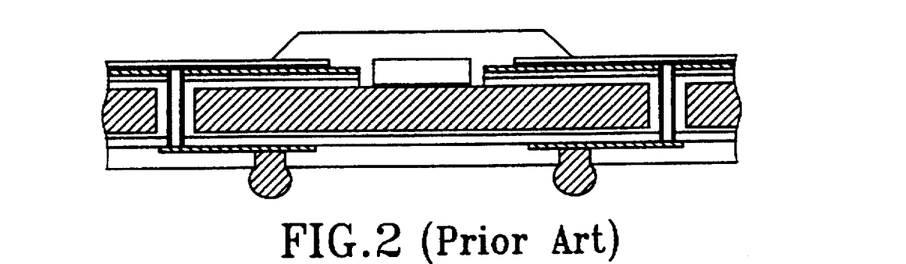
FIG. 2 is a cross section view of a structure of another prior art.
Figure 3A:
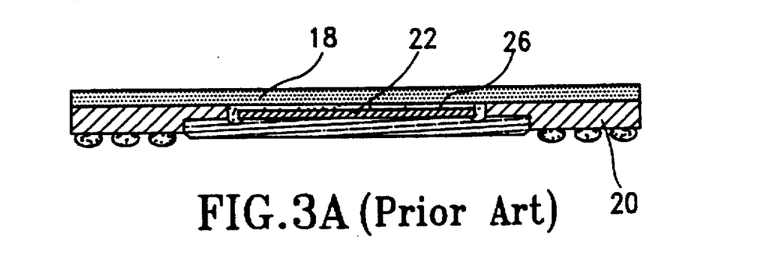
FIG. 3A and 3B are cross section views of structures of a third, and a forth prior art.
Figure 3B:
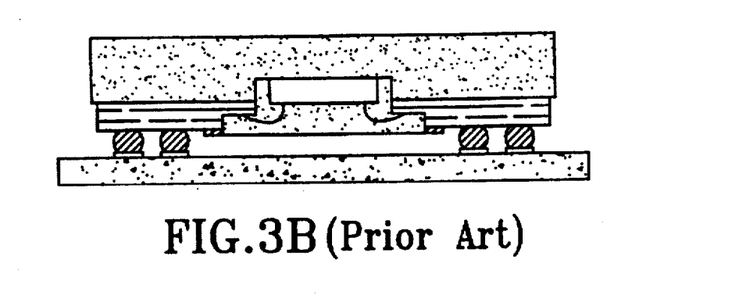

Developments in interconnect and packing have been quite modest in comparison. The renewed interest in high density hybrid is driven by the requirement to handle large numbers of IC interconnections, the increasing clock rate of digital systems and the desire to pack greater functionality into smaller spaces. Therefore, the number of a package's leads becomes more and more. For example, a package known as Pin grid array (PGA) can accommodate over 200 leads. An important consideration in making small, high speed and high density devices is providing packages capable of the spreading heat generated by the devices. A further problem confronting the technology is the relentless need for more I/O per chip. A conventional leadframe package, such as SOP, PQFP, has a limitation to increase the number of the package's lead. In addition, the maximum speed of the leadframe package is less than 100 MHz, that can not meet the manufacturers' desire. One response to the requirement of providing packages for high speed and density devices has been developed. One such package type is plastic ball grid array (PBGA) that uses a bismaleimide-traizine (BT) as a substrate. The PBGA offers many advantages over conventional packages such as solder ball I/O and high speed. The PBGA package has high speed due to a short path for signal transformation. The solder balls are set on a package surface in a matrix array which can provide more signal contacts. Although the PBGA has a shorter path for spreading heat than a conventional package, but a heater spreader or a heat slug can not be set on the backside of a die paddle due to the structure of the PBGA. Further, the substrate of the PBGA is made of BT so that the efficiency of spreading heat is poorer than the leadframe package. As shown in FIG. 1, in order to solve the problem, pad array semiconductor devices have been proposed (see U.S. Pat. No. 5,285,352). Use of a thermal conductor 2 in a pad array device permits routing of conductive traces 4 and terminals beneath a semiconductor die for improved utilization of substrate 6 area. An opening 8 and thermal conductor 2 are set under the die 10 on BT substrate 6. The heat that is generated by devices is dissipated to computer board via silver epoxy 12, the opening 8 and a metal ground plane 14. Solder bails are represent by 16. As shown in FIG. 2, another structure has been disclosed in U.S. Pat. No. 5,397,917 to increase the efficiency of dissipating heat. In this structure a core base in BT substrate is replaced by a metal to increase the surface of spreading heat. However, both of the structures that are described above have a limitation to dissipate heat from devices. A so called cavity down structure is shown in FIG. 3A, a copper heatsink 18 is capped on a substrate 20. A die 22 is attached on the copper heatsink 18 by using die attach material, such as silver epoxy 26. Heat is dissipated out of the die 22 via silver epoxy 26 and the copper heatsink 18. Yet another structure uses a metal substrate that combines the substrate and heatsink to increase the efficiency of spreading heat. Unfortunately, no matter the cavity down structure or this structure is very expensive in cost. Further, the orders of pin arrangement of these two types are different from the present method and can not be compatible with a printed circuit board (pcb) up to now.

SUMMARY OF THE INVENTION

The present invention discloses a way of enhancing the method to increase the efficiency of spreading heat. In the present invention, heat is dissipated out of a die only via a heatspreader and a package body, that provides a shorter path than conventional one for spreading heat. The structure of the present invention will not change the formation current of forming a package. The order of pin arrangement of the present invention is the same with present method and is compatible with a pcb. The feature of the present invention is a heatspreader that is set over a die instead of being set under the die.

A package includes a semiconductor die mounted to a top surface of a substrate. The die and a portion of the substrate 104 are connected by using silver epoxy. A plurality of bonding wires are attached on the die. Further, conductive traces are on the top surface of the substrate. Solder balls that are set at the bottom surface of the substrate. In general, the solder balls are arranged in a matrix array configuration. A heatspreader is exactly set over the semiconductor die for spreading heat. It is different from the conventional heatspreader that is set under a die.

In first embodiment, the heatspreader is a square plane having four first supporters that are at the corners and along the diagonal lines protruded from the square plane. The first supporters are used to prevent the die from being moved, damage while the heatspreader is set in the cavity of the package body. The supporters are respectively mounted at the four corners of the cavity. The heatspreader has a shallow dish-like recessed portion. Suitable downset of the recessed portion can prevent the bonding wires from being damage by the heatspreader. The bottom of the shallow recessed portion contacts the top surface of the die to dissipate heat from the die. Four hemispherical downward projections are on the surface of the heatspreader to protect the die and connected to the top surface of the substrate as second supporters of the heatspreader. The downset of the hemispherical downward projection is deeper than the one of the shallow dish-like recessed portion. Four hemispherical hills are also on the top surface of the heatspreader for connecting to the body package to serve as third supporters. A plurality of openings are set on the surface of the heatspreader.

In a second embodiment, the heatspreader is a square metal. A recessed portion is on the center of the heatspreader for attaching to the top surface of the die. The cross section view of the cavity is a portion of a curve. A plurality of first openings are set on the surface of the heatspreader for letting epoxy to be filled with the space where is among the die, heatspreader and package body. The four first openings are at four corners of a square that is shift degree with the heatspreader. A plurality of second openings are radially located on the heatspreader and between two first openings. The second openings can be any suitable shape, for example, a medical capsule shape. Further, a plurality of third openings may be on the edge of the heatspreader for reducing delamination.

Another embodiment of the present invention is a heatspreader having a recessed portion which is located at the center of the heatspreader. A plurality of first openings are radially set on the surface of the heatspreader. A plurality of second openings are on the edge of the heatspreader. The first openings and the second openings are all for reducing delamination. Moreover, four supporters can be used to attached to the surface of the substrate. The supporters are hemispherical downward projections which are closely located at the corners of the heatspreader, respectively. The downset of the supporter has to be deeper than the one of the cavities to protect the bonding wires.

DETAILED DESCRIPTION OF THE PREFERRED EMBODIMENT

The present invention discloses a way of enhancing the method to increase the efficiency of spreading heat. The feature of the present invention is a heatspreader that is set over a die instead of being set under the die. In a conventional package, the heat is spread from the die via six layers of material that are a die, silver epoxy, a conductive opening, a substrate, a metal plate and solder balls. It only needs three layers of material to dissipate heat in the present invention.

Figure 4A:
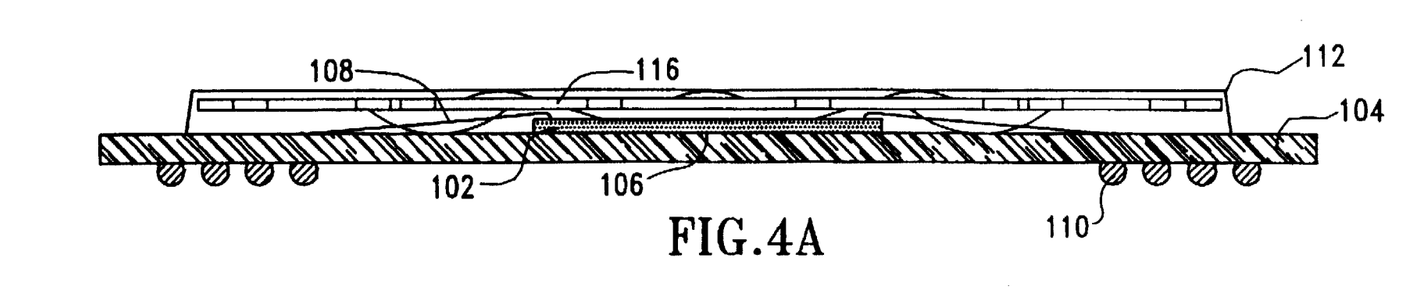
FIG. 4A is a cross section view of the structure of a package according to a first embodiment.

FIG. 4A is a cross section view of a first embodiment of the present invention. A package includes a semiconductor die 102 attached to a die receiving area on the top surface of a substrate 104. Typically, the substrate 104 is made of BT, it will be appreciated that any suitable material can be used as the substrate 104. The die 102 and a portion of the substrate 104 are connected by using a conventional die attach material 106, such as silver epoxy. General speaking, the die 102 will be a memory or IC, which generates a lot of heat during operation. A plurality of bonding wires 108 are attached on the die 102. Further, conductive traces are on the top surface of the substrate 104. In many cases, conductive traces are also on a bottom surface of the substrate 104. The die 102 is electrically coupled to conductive traces by the bonding wires 108 or other well known coupling methods such as a TAB method, a flip chip method. A plurality of conductive vias are also needed for electrically coupling conductive traces on the top surface of the substrate 104 to those on the bottom. Typically, at an end of portion of each conductive trace on the bottom of the substrate 104 is a conductive pad for connecting to a solder ball 110. In the preferred embodiment, the conductive traces and pad is made of copper or any conductive metal. Solder balls 110 are terminals of a device which permit electrical signal transfer to the die 102. In general, the solder balls 110 are arranged in a matrix array configuration. The die 102 and portions of the substrate 104 are encapsulated in a package body 112. In the present invention, package also includes a heatspreader 116 that is exactly set over the semiconductor die 102 for spreading heat. It is different from the conventional heatspreader that is set under a die.

Figure 4B:
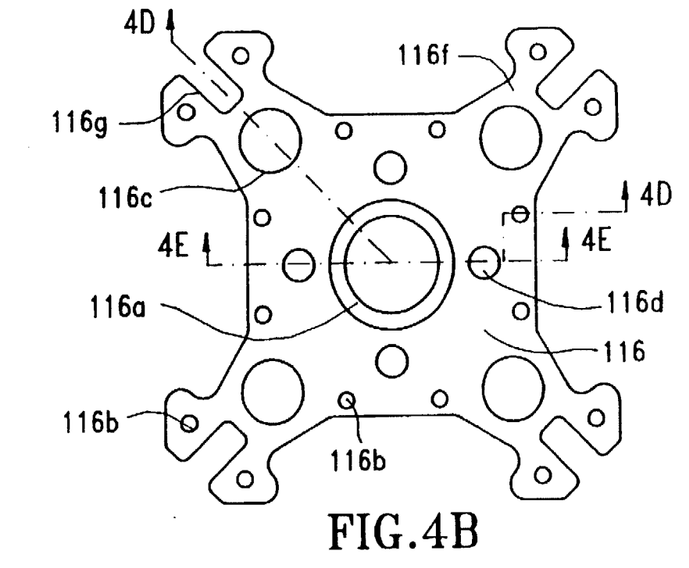
FIG. 4B is the top view of a heatspreader according to the first embodiment.
Figure 4C:
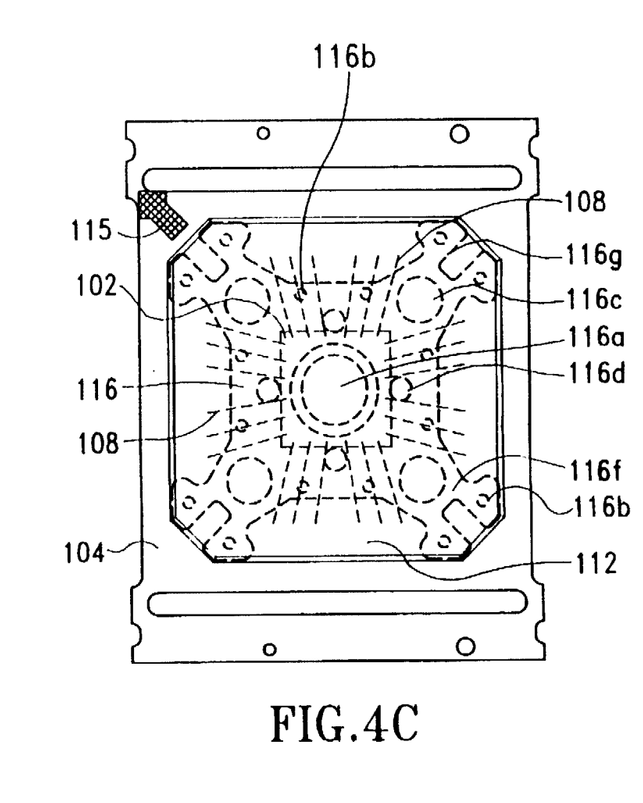
FIG. 4C is a top view of the structure of a package according to the first embodiment.
Figure 4D:
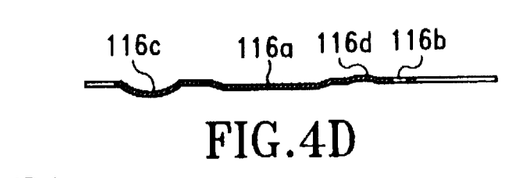
FIG. 4D is a cross section view of the heatspreader used in the package of FIG. 4B.
Figure 4E:
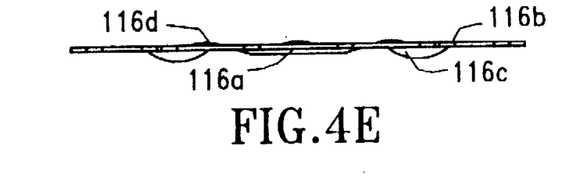
FIG. 4E is a cross section view of the heatspreader used in the package of FIG. 4B.

Referring to FIG. 4B and 4C, the heatspreader 116 is a square (or rectangular) plane having four trapezoid shape first supporters 116f that are at the corners and along the diagonal lines protruded from the square (or rectangular) plane. The first supporters 116f are used to prevent the die 102 from being moved and being damaged while the heatspreader 116 is set in the package body 112. The supporters 116f are respectively connected at the four corners of the package body 112. Each supporter 116f has a rectangular indented portion 116g which is in the direction of a transfer molding direction 115 for improving the molding compound completely filled in the package body. The heatspreader 116 has a shallow dish-like recessed portion 116a. The dish-like recessed portion 116a protrudes from the bottom-said surface of the heatspreader 116. Suitable downset of the cavity of the dish-like recessed portion 116a can prevent the bonding wires 108 from being damage by the heatspreader 116. The bottom of the shallow dish-like recessed portion 116a contacts the top surface of the die 102 to dissipate heat from the die 102. Four hemispherical downward projections 116c are on the surface of the heatspreader 116 to protect the die 102 and connected to the top surface of the substrate as second supporters of the heatspreader 116. The downset of the hemispherical downward projections 116c is deeper than the one of the shallow dish-like recessed portion 116a. In the preferred embodiment, the hemispherical downward projections 116c are close to the corners of the heatspreader 116, respectively. Further, from the top view, the centers of the cavities 116c are located on the diagonal lines. Four hemispherical raised portions 116d are also on the top surface of the heatspreader 116 adjacent to the die 102 for connecting to the body package 112 to serve as third supporters. In the preferred embodiment, a plurality of openings 116b are set at the edge of the heatspreader 116. The openings 116b are used to let the compound be filled within the body package 112. The 4D—4D 4E—4E of the FIG. 4B represent the portion of the heatspreader 116 through which the cross section views FIG. 4D and 4E are taken.

Figure 5A:
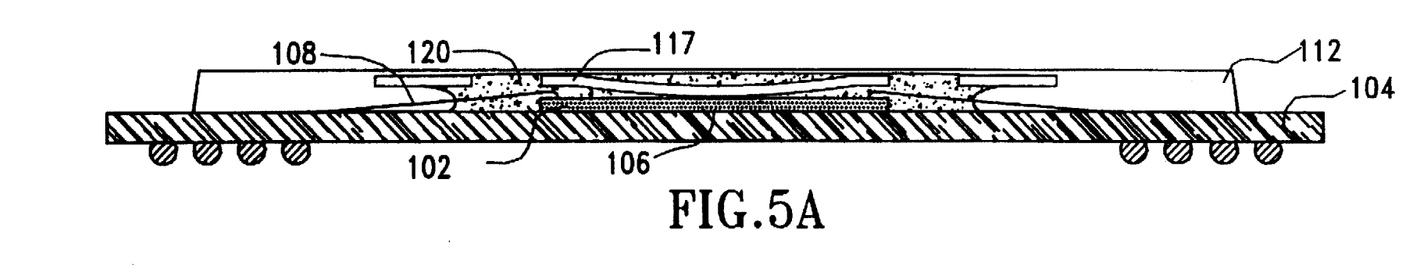
FIG. 5A is a cross section view of the structure of a package according to a second embodiment.

FIG. 5A shows a second embodiment of the present invention. It can be seen in the drawing, a heatspreader 117 is also attached on the die 102 via a die attaching material such as epoxy. The elements of the package are all the same with the first embodiment except the shape of the heatspreader 117 and the way to mount it on the die 102.

Figure 5B:
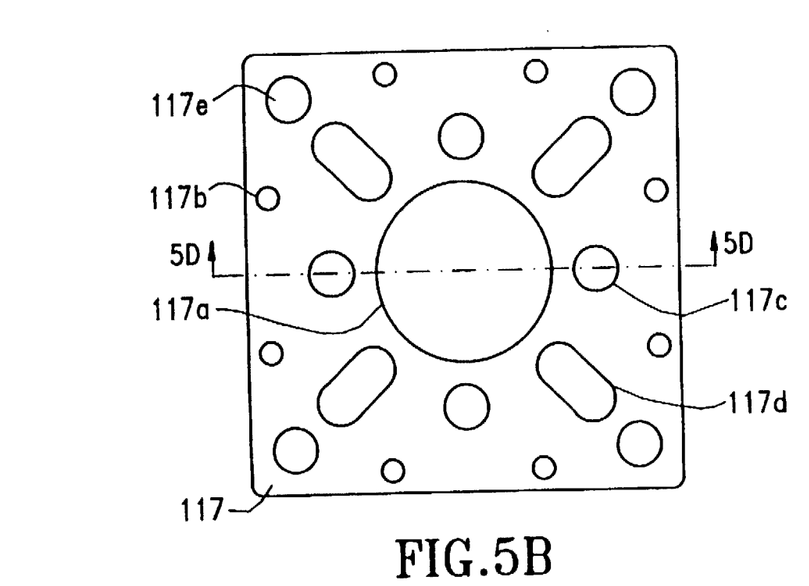
FIG. 5B is the top view of a heatspreader according to the second embodiment.
Figure 5C:
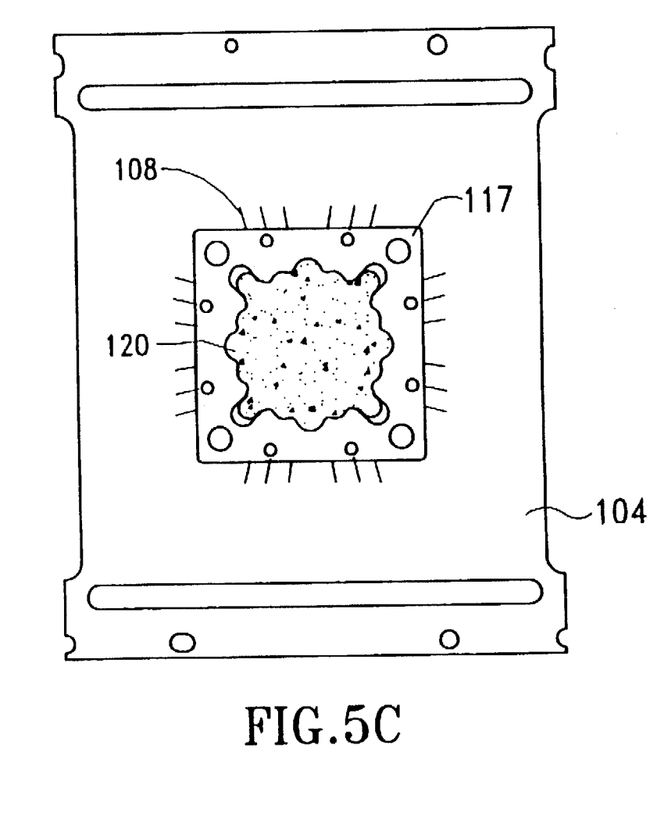
FIG. 5C is a top view of the structure of a package according to the second embodiment.
Figure 5D:
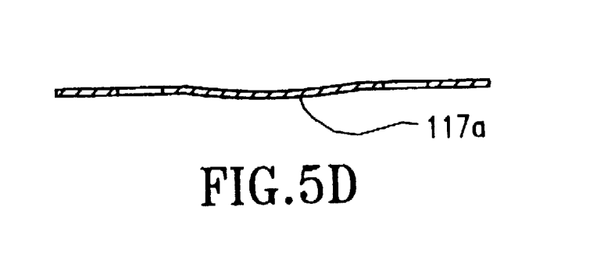
FIG. 5D is a cross section view of the heatspreader used in the package of FIG. 5B.

Turning to FIG. 5B and 5C, in the second embodiment, the heatspreader 117 is a square metal made of copper or other suitable material. A recessed portion 117a is on the center of the heatspreader 117 for attaching to the top surface of the die 102. The recessed portion 117a protrudes from the bottom side surface of the heatspreader 117. The cross section view of the recessed portion 117a is a portion of a curve. That is to say the recessed portion 117a is bowl-shaped. The recessed portion 117a has a smooth surface which will not cause damage on the die's surface. Another benefit of the bowl-shaped recessed portion 117a is to prevent the bonding wires 108 from being damage by the heatspreader 117. A plurality of first openings 117c are set on the surface of the heatspreader 117 for letting epoxy or die attaching material 120 to be filled within the space which is among the die 102, heatspreader 117 and package body. Further, in preferred embodiment, the recessed portion 117a is also filled with epoxy or die attaching material 120 so that the heatspreader 117 will not be moved while a transfer molding is carried out. As matter of fact, the centers of the four first openings 117c are at four corners of a square which is shifted 45 degree with the heatspreader 117. In addition, the bowl-shaped recessed portion 117a is surround by the four first openings. In order to enhance the filled epoxy 120 to be formed as above described. A plurality of second openings 117d are radially located on the heatspreader 117 and between two first openings 117c. The second openings 117d can be any suitable shape, for example, a medical capsule shape or ellipse. The second openings 117d are located on the diagonal lines, respectively. Further, a plurality of third openings 117b may be on the edge of the heatspreader 117 for reducing delamination. Moreover, four supporters 117e can be used to attach to the surface of the substrate 104. The supporters 117e are hemispherical downward projections that are closely located at the corners of the heatspreader 117, respectively. Similarly, the downset of the supporter 117e is deeper than the one of the recessed portion 117a. FIG. 5D is a cross section view of the heatspreader used in the package according to the 5D—5D line in the FIG. 5B.

Another embodiment of the present invention will be seen as follows. The differences between the third embodiment and the first embodiment are also the structure of the heatspreader and the way to fix it on a die.

Figure 6A:
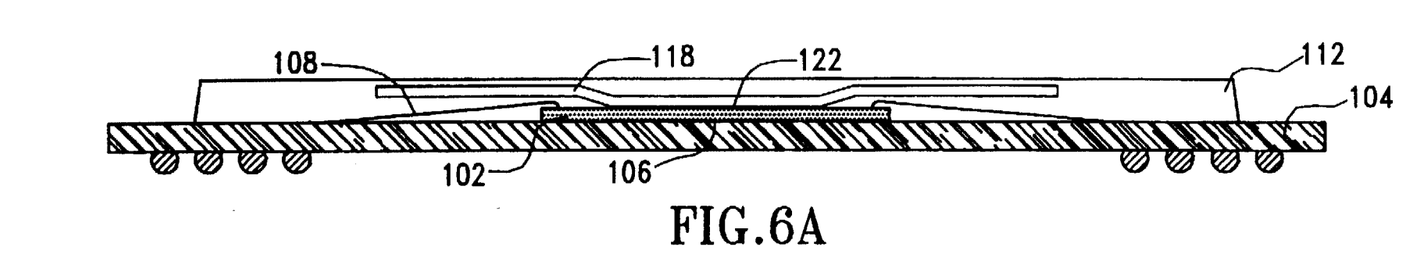
FIG. 6A is a cross section view of the structure of a package according to a third embodiment.
Figure 6B:
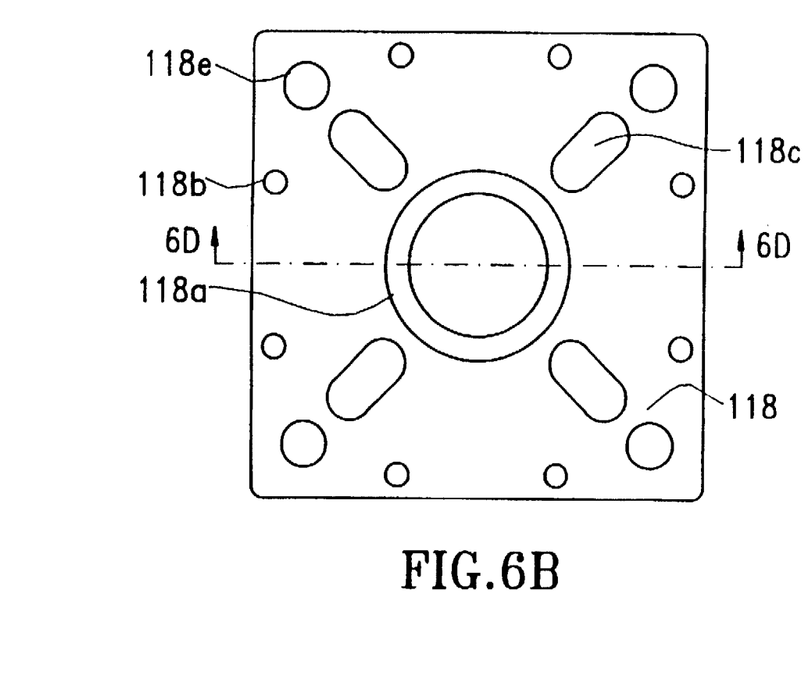
FIG. 6B is the top view of a heatspreader according to the third embodiment.
Figure 6C:
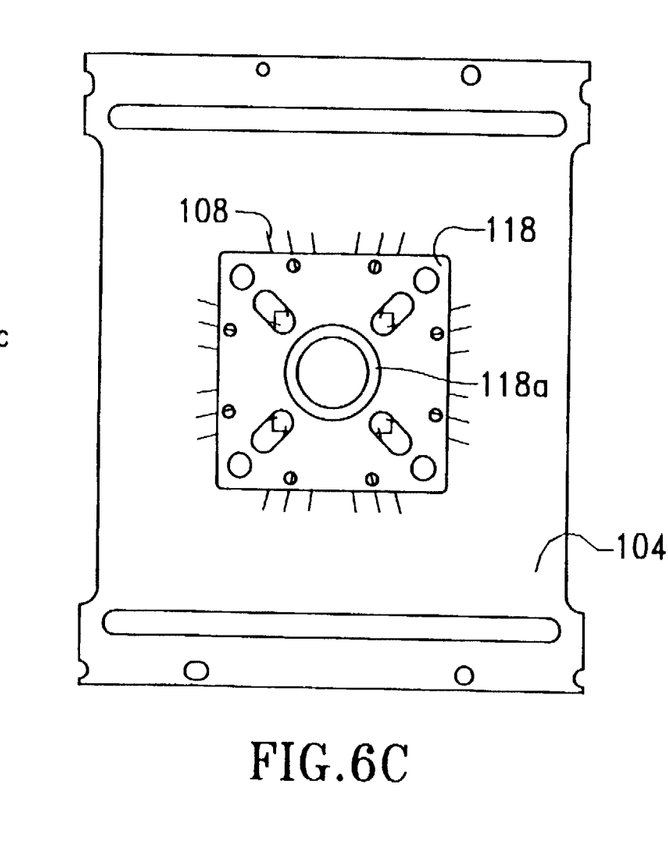
FIG. 6C is a top view of the structure of a package according to the third embodiment.
Figure 6D:
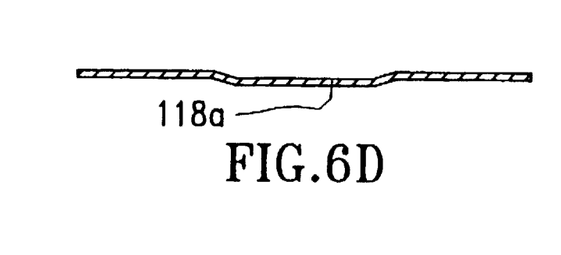
FIG. 6D is a cross section view of the heatspreader used in the package of FIG. 6B.

As shown in FIG. 6A, the heatspreader 118 is also attached on the top surface of the die 102 using a tape 122. Turning to FIG. 6B, FIG. 6C, the heatspreader 118 includes a dish-like recessed portion 118a for attaching to the die 102 and preventing the bonding wires 108 from damage by the heatspreader 118. Typically, from the top view the center of the recessed portion 118a is located at the center of the heatspreader 118. A plurality of first openings 118c are radially set on the surface of the heatspreader 118. Further, a plurality of second openings 118b may be on the edge of the heatspreader 118. The first openings and the second openings are used for reducing delamination. In a preferred embodiment, the first openings 118c are medical capsule shape and located on the diagonal lines. The second openings 118b are set on the edge of the heatspreader 118. Moreover, four supporters 118e can be used to attach to the surface of the substrate 104. The supporters 118e are hemispherical downward projections which are closely located at the corners of the heatspreader 118, respectively. Similarly, the downset of the supporter 118e has to be deeper than the one of the recessed portion 118a to protect the bonding wires 108. The 6D—6D of the FIG. 6B represents the portion of the heatspreader 118 through which the cross section view FIG. 6D is taken.

Figure 7A:
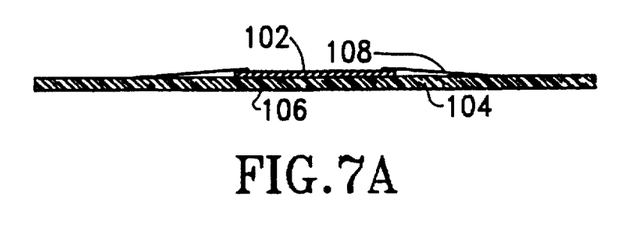
FIG. 7A to FIG. 7I are the steps of forming the second embodiment.

The formation of the second embodiment is described as follows. As shown in FIG. 7A, a so call die bond (D/B) and a wire bond (W/D) steps are performed to set the die 102 and bonding wires 108 on a substrate 104.

Figure 7B:
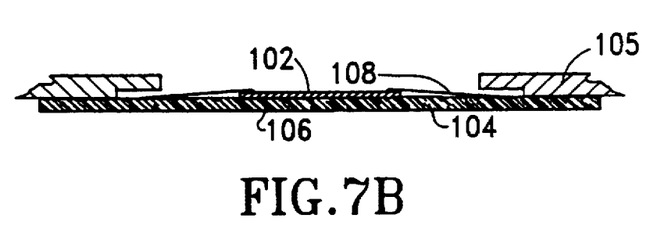
Figure 7C:
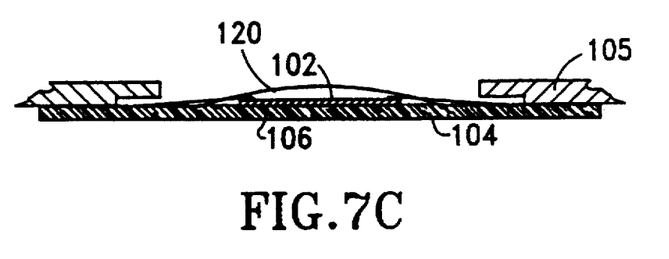

See next to FIG. 7B, a jig 105 is set on the substrate for alignment. Turning to FIG. 7C, the epoxy 120 is coated on the die 102, the substrate 104 and a portion of the bonding wires 108 via the opening of the jig 105. This step can protect the die 102, bonding wires 108 from moisture.

Figure 7D:
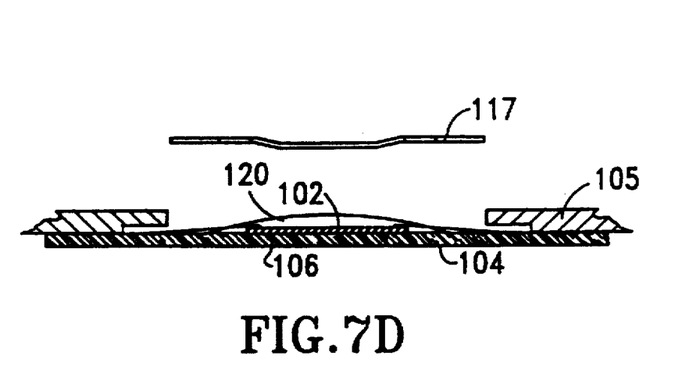
Figure 7E:
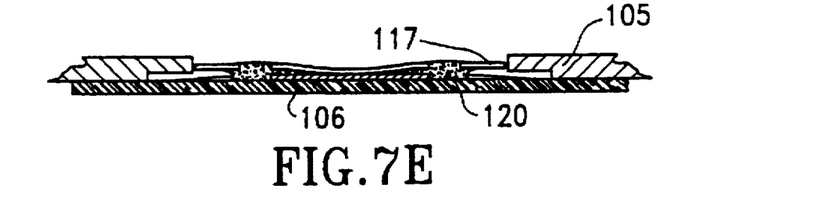

As shown in FIG. 7D, the heatspreader 117 is set onto the die surface and aligned by using the jig 105. An external force is suitably performed on the heatspreader 117 surface so that the epoxy 120 will over flow to the surface of the heatspreader 117 via the first openings 117c and the second openings 117d, as shown in FIG. 7E.

Figure 7F:
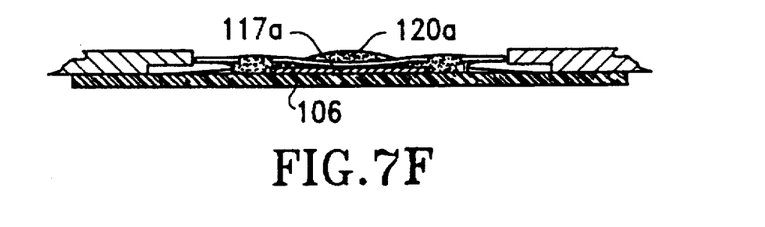

See FIG. 7F, the heatspreader 117 is attached on the die 102 using the epoxy 120.

Figure 7G:
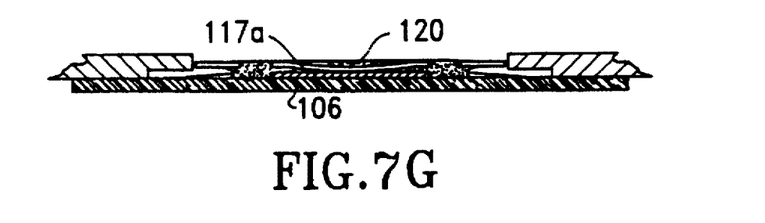

FIG. 7G shows the recessed portion 117a is filled with the epoxy 120.

Figure 7H:
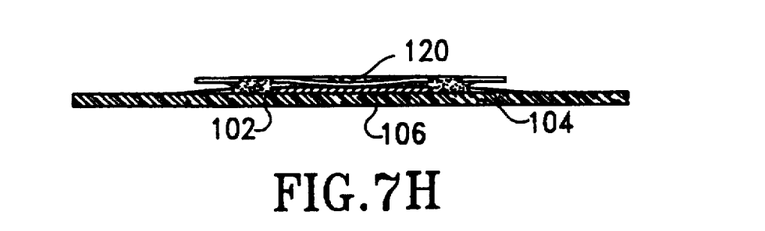

Referring to FIG. 7H, the jig 105 is removed after the cure step is done.

Figure 7I:
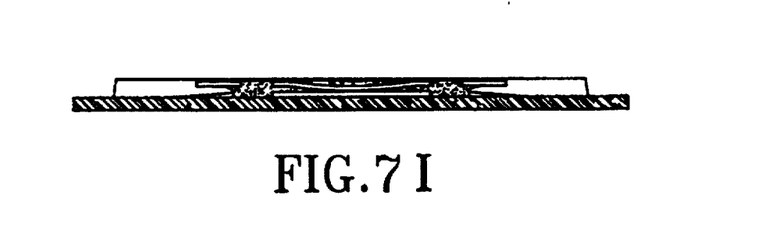

As shown in FIG. 7I, the final step of the formation of the second embodiment is a standard transfer molding process.

In addition, in order to set a vision system for alignment instead of the jig 105. A plurality of the supporters 117e which are hemispherical downward projections are needed to set at the edge of the heatspreader 117. Similarly, the downset of the supporter 117e is deeper than the one of the recessed portion to contact to the substrate 104.

FIG. 8A to FIG. 8H are the steps of forming the heatspreader 118 on the substrate 104 in accordance with the third embodiment.

Figure 8A:
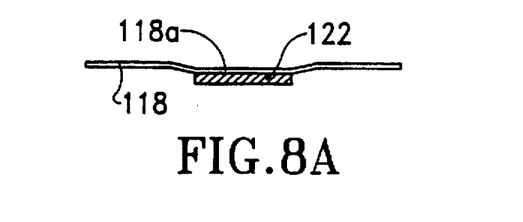
FIG. 8A to FIG. 8H are the steps of forming the third embodiment.

As shown in FIG. 8A, the tape 122 is taped on the back side of the dish-like recessed portion 118a of the heatspreader 118.

Figure 8B:
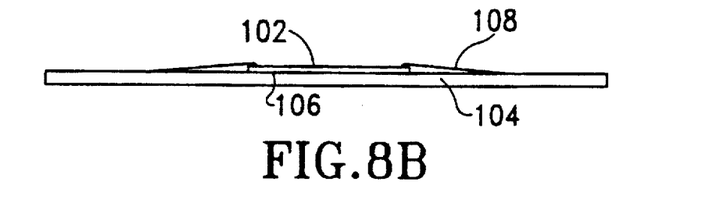

Referring to FIG. 8B, a die bond (D/B) and a wire bond (W/D) steps are used to set the die 102 and bonding wires 108 on a substrate 104.

Figure 8C:
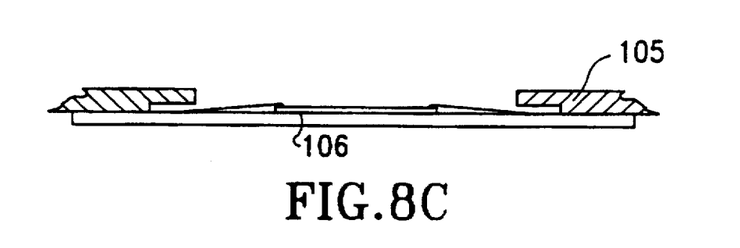

Turning to FIG. 8C, a jig 105 is set on the substrate for alignment.

Figure 8D:
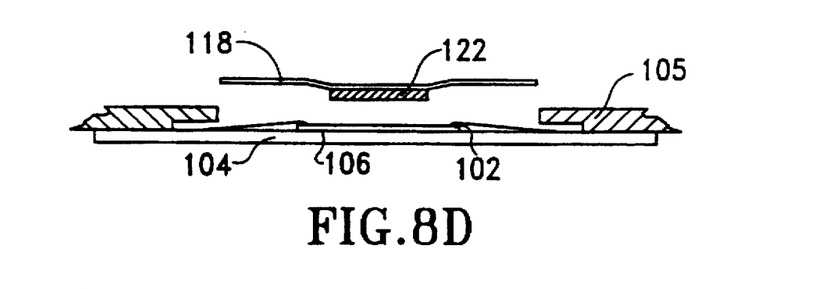

Turning next to FIG. 8D, the heatspreader 177 is put on the top surface of the die 102.

Figure 8E:
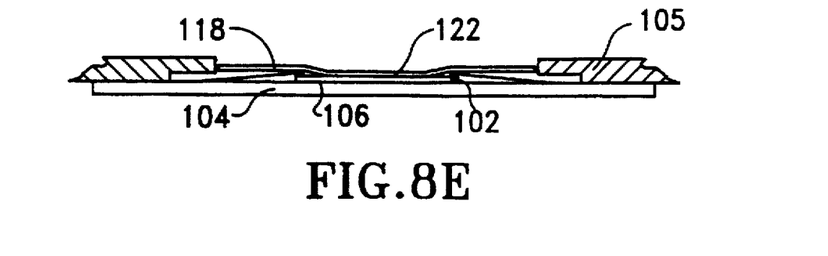

See next to FIG. 8E, the position of the heatspreader 117 is adjusted by using the jig 105 for alignment.

Figure 8F:
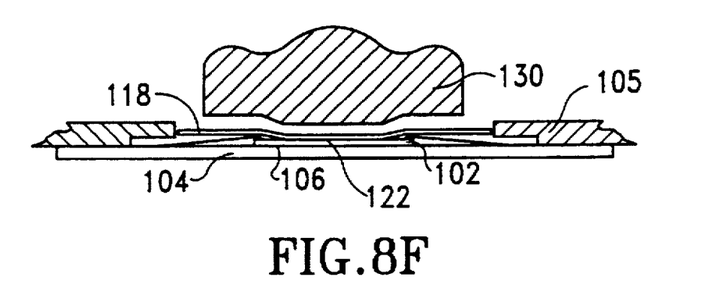

Referring to FIG. 8F, a thermal pressure is performed on the surface of the heatspreader 118 by using a thermohead 130, therefore the heatspreader 118 will be attached on the die 102 via the attached material that is the tape 122.

Figure 8G:
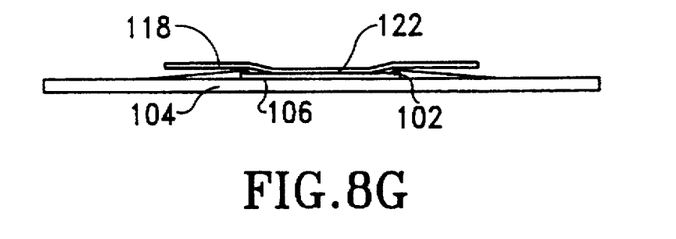

Referring to FIG. 8G, the jig 105 is removed after the heatspreader 118 is attached on the die 102.

Figure 8H:
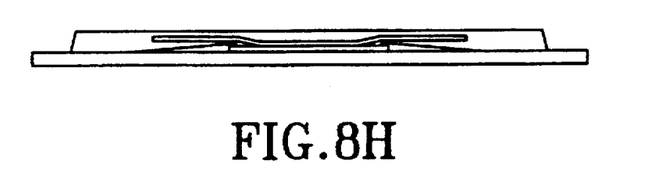

As shown in FIG. 8H, the final step of the formation of the package is a standard transfer molding process.

In addition, in order to set a vision system for alignment instead of the jig 105. A plurality of the supporters 118e which are hemispherical downward projections are need to set at the edge of the heatspreader 118. Similarly, the downset of the supporter 118e is deeper than the one of the portion 118a for contacting to the substrate 104.

The formation of the first embodiment is similar to the method of formation or the second, the third embodiments as above described. So that it is not necessary to be described in detail here. The advantages of the present invention are:

Heat is spreaded out of a die only via a heatspreader and a package body, that provides a shorter path than conventional one for spreading heat.

The structure of the present invention will not change the formation current of forming a package.

The order of pin assignment of the present invention is the same with present method and is compatible with a pcb.

The structure and method improve the efficiency of spreading heat for a package.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A structure of a semiconductor package, said structure comprising:
    a substrate having a die receiving area and a plurality of conductive traces;
    a semiconductor die mounted to said substrate within said die receiving area for electrically coupling to said conductive traces;
    signal transferring means for transferring an electrical signal to said die set on bottom-side surface of said substrate, said signal transferring means comprising a solder ball array;
    heat spreading means for spreading heat mounted over said die, said heat spreading means including a plane, a recessed portion formed on a surface of said plane and having a first downset, said recessed portion contacting the die and protecting bonding wires, a plurality of first supporters formed on said plane for connecting to said substrate, and a plurality of first openings formed at edges of said plane, and
    covering means for covering said die,
    wherein said die and said heat spreading means are within said covering means, and said plurality of first openings are used to let a compound be filled within said covering means.

2. The structure of claim 1, wherein said heat spreading means further comprises:
    a plurality of second supporters protruding from corners of said plane and connected to said covering means for support and preventing delamination; and
    a plurality of third supporters set on the surface of said plane for connecting to said covering means.

3. The structure of claim 2, wherein said plurality of second supporters have indented portions that are parallel to a transfer molding direction.

4. The structure of claim 2, wherein said plurality of first supporters comprise first hemispherical downward projections set close to the corners of said plane, said first hemispherical downward projections having second downsets which are deeper than said first downset.

5. The structure of claim 2, wherein said plurality of third supporters comprise hemispherical raised portions adjacent to said die.

6. The structure of claim 1, wherein said heat spreading means further comprises:
    die attaching material for connecting said heat spreading means to said die
    a plurality of second openings formed on the surface of said plane for letting said die attaching material be filled in a space among said die, said heat spreading means and said covering means;
    a plurality of third openings formed on the surface of said plane for letting said die attaching material, compound be filled within said covering means.

7. The structure of claim 6, wherein said plurality of first supporters comprise first hemispherical downward projections set close to corners of said plane and having second downsets which are deeper than said first downset.

8. The structure of claim 6, wherein said recessed portion is bowl-shaped.

9. The structure of claim 1, wherein said heat spreading means further comprises:
    a tape for connecting said heat spreading means to said die; and
    a plurality of openings formed on said surface of said plane for letting compound be filled in the space among said die, said heat spreading means and said covering means.

10. The structure of claim 1, wherein said die is electrically coupled to said substrate by a wire bond method.

11. The structure of claim 1, wherein said die is electrically coupled to said substrate by a TAB method.

12. The structure of claim 1, wherein said die is electrically coupled to said substrate by a flip chip method.

13. The structure of claim 1, wherein said covering means comprises a mold compound.

14. A structure of a semiconductor package, said structure comprising:
    a substrate having a die receiving area and a plurality of conductive traces;
    a semiconductor die attached to said substrate within said die receiving area for electrically coupling to said conductive traces;
    signal transferring means for transferring electrical signals to said die set on a bottom-side surface of said substrate;
    covering means for covering said die; and
    heat spreading means mounted over said die, wherein said heat spreading means includes:
    a plane for spreading heat generated by said die,
    a recessed portion having a first downset being formed on a surface of said plane for protecting bonding wires and contacting said die,
    a plurality of first supporters set on said plane for connecting to said substrate,
    a plurality of second supporters protruding from corners of said plane and connecting to said covering means for improving support and preventing delamination, a plurality of third supporters set on said plane for connecting to said covering means, and a plurality of openings formed at edges of said plane for letting compound being filled within said covering means, wherein said die and said heat spreading means are within said covering means.

15. The structure of claim 14, wherein said plurality of first supporters are set close to corners of said plane, and comprise first hemispherical downward projections having second downsets, said second downsets being deeper than said first downset.

16. The structure of claim 14, wherein said plurality of second supporters have indented portions.

17. The structure of claim 14, wherein said plurality of third supporters comprise hemispherical raised portions adjacent to said die.

18. The structure of claim 14, wherein said die is electrically coupled to said substrate by a wire bond method.

19. The structure of claim 14, wherein said die is electrically coupled to said substrate by a TAB method.

20. The structure of claim 14, wherein said die is electrically coupled to said substrate by a flip chip method.

21. The structure of claim 14, wherein said covering means comprises a mold compound.

22. A structure of a semiconductor package, said structure comprising:

a substrate having a die receiving area and a plurality of conductive traces;

a semiconductor die attached to said substrate within said die receiving area for electrically coupling to said conductive traces;

signal transferring means for transferring an electrical signal to said die set on a bottom-side surface of said substrate;

covering means for covering said semiconductor die; and heat spreading means mounted over said die, wherein said heat spreading means includes:

a plane having a surface with a recessed portion formed therein, said recessed portion having a first downset and said plane being attached to said die via die attaching material;

a plurality of first openings formed in said plane for permitting said die attaching material to fill a space between said die and said plane, a plurality of second openings formed at edges of said plane, and a plurality of first supporters formed on said plane for connecting to said substrate, wherein said die and said heat spreading means are within said covering means.

23. The structure of claim 22, wherein said plurality of first supporters are set close to corners of said plane, and comprise first hemispherical downward projections having second downsets, said second downsets being deeper than said first downset.

24. The structure of claim 22, wherein said recessed portion is bowl-shaped.

25. The structure of claim 22, wherein said die is electrically coupled to said substrate by a wire bond method.

26. The structure of claim 22, wherein said die is electrically coupled to said substrate by a TAB method.

27. The structure of claim 22, wherein said die is electrically coupled to said substrate by a flip chip method.

28. The structure of claim 22, wherein said covering means comprises a mold compound.

29. A structure of a semiconductor package, said structure comprising:

a substrate having a die receiving area and a plurality of conductive traces;

a semiconductor die attached to said substrate within said die receiving area for electrically coupling to said conductive traces;

signal transferring means for transferring an electrical signal to said die set on a bottom-side surface of said substrate;

covering means for covering said die connected to said substrate; and heat spreading means, wherein said heat spreading means includes:

a plane attached to said die via a tape for spreading heat, a dish-like recessed portion having a first downset formed on a surface of the plane, said dish-like portion contacting the die via the tape and protecting bonding wires, and a plurality of first openings formed on said plane for letting compound be filled in a space between said die and said heat spreading means, wherein said die and said heat spreading means are within said covering means.

30. The structure of claim 29, wherein said plurality of first openings are formed at edges of said plane.

31. The structure of claim 29, wherein said heat spreading means further comprises:

a plurality of first hemispherical downward projections formed on said plane and connected to said substrate, said plurality of first hemispherical downward projections having second downsets deeper than said first downset.

32. The structure of claim 29, wherein said die is electrically coupled to said substrate by a wire bond method.

33. The structure of claim 29, wherein said die is electrically coupled to said substrate by a TAB method.

34. The structure of claim 29, wherein said die is electrically coupled to said substrate by a flip chip method.

35. The structure of claim 29, wherein said covering means comprises a mold compound.

36. A semiconductor package comprising:

a substrate having a die receiving area;

a semiconductor die attached to said substrate within said die receiving area;

heat spreading means mounted on said die, wherein said heat spreading means includes:

a plane having a recessed portion formed therein, said recessed portion having a first downset and being attached to said die for conducting heat generated by said die; and a plurality of downward projections formed on said plane, said downward projections having a second downset greater than said first downset, said plurality of downward projections contacting said substrate on which said die is mounted.

37. The semiconductor package of claims 36, wherein the downward projections have a hemispherical shape.

* * * * *